United States Patent
Huang et al.

(10) Patent No.: US 8,172,622 B1
(45) Date of Patent: May 8, 2012

(54) SOCKET STRUCTURE STACK AND SOCKET STRUCTURE THEREOF

(75) Inventors: Chun-Ming Huang, Hsinchu (TW);
Hui-Ming Lin, Hsinchu (TW);
Chih-Chyau Yang, Hsinchu (TW);
Chien-Ming Wu, Hsinchu (TW);
Shih-Lun Chen, Hsinchu (TW)

(73) Assignees: National Chip Implementation Center, Hsinchu (TW); National Applied Research Laboratories, Hsinchu (TW)

( * ) Notice: Subject to any disclaimer, the term of this patent is extended or adjusted under 35 U.S.C. 154(b) by 0 days.

(21) Appl. No.: 13/183,595

(22) Filed: Jul. 15, 2011

(30) Foreign Application Priority Data

Jun. 21, 2011 (TW) .................................. 100121551

(51) Int. Cl.
*H01R 13/502* (2006.01)
(52) U.S. Cl. ........................................................ 439/701
(58) Field of Classification Search .................. 439/701, 439/540.1, 543, 714, 715–716
See application file for complete search history.

(56) References Cited

U.S. PATENT DOCUMENTS

| | | | |
|---|---|---|---|
| 6,059,612 A * | 5/2000 | Aoyama et al. ............... | 439/701 |
| 7,186,151 B2 * | 3/2007 | Komiyama ................... | 439/701 |
| 7,503,768 B2 * | 3/2009 | Tutt et al. ..................... | 439/66 |
| 2007/0184681 A1 * | 8/2007 | Tutt et al. ..................... | 439/67 |
| 2011/0096506 A1 * | 4/2011 | Huang et al. ................. | 361/707 |

* cited by examiner

*Primary Examiner* — Tulsidas C Patel
*Assistant Examiner* — Phuongchi Nguyen
(74) *Attorney, Agent, or Firm* — Stites & Harbison, PLLC; Juan Carlos A. Marquez, Esq (57) ABSTRACT

A socket structure stack and a socket structure thereof are provided. The socket structure stack includes at least two socket structures, and each socket structure includes a main body, a plurality of conductive elements, and a plurality of connecting elements. The main body includes an inner plate and an outer plate, wherein the inner plate has a receiving portion and an embedded portion. The conductive elements are embedded in the embedded portion, and the connecting elements are mounted on the outer plate so as to connect adjacent socket structures together. The socket structures are so configured that ICs, processors, and printed circuit boards connected to the socket structures or the socket structures themselves can be recycled. Moreover, the printed circuit boards can be easily assembled to the socket structures, and the socket structures can be stacked up and securely connected to form a 3D structure which is otherwise difficult to put together by soldering.

10 Claims, 8 Drawing Sheets

SOCKET STRUCTURE STACK AND SOCKET STRUCTURE THEREOF

BACKGROUND OF THE INVENTION

1. Technical Field

The present invention relates to a socket structure stack and a socket structure thereof. More particularly, the present invention relates to a socket structure stack for connecting with printed circuit boards that are mounted with electronic devices, and to a stackable socket structure for forming the socket structure stack.

2. Description of Related Art

Conventionally, electronic devices such as northbridge chips, voice chips, processors, dynamic random access memories (DRAMs), and integrated circuits (ICs) are soldered to a printed circuit board, and then the printed circuit board is connected to a socket structure. The socket structure has one end formed with conductive terminals for making electrical connection with the electronic devices and another end provided with pins or solder balls for connecting with the printed circuit board.

There are currently several standard specifications regarding the pins of such socket structures, and these standard specifications are adopted by electronic device manufacturers, printed circuit board manufacturers, and socket structure manufacturers alike when making new products. Therefore, electronic devices of a newer generation will still be applicable to, i.e., compatible with, printed circuit boards and socket structures that are made according to the standard specifications. The standardization of specifications is intended to facilitate the development and production of new products in the electronic industry.

Now that all socket structures and printed circuit boards conform to the standard specifications, it is theoretically feasible to detach and recycle used socket structures and printed circuit boards and use them in new electronic products. However, in order to ensure optimal signal transmission between a socket structure and a printed circuit board connected thereto and prevent the printed circuit board from coming off the socket structure, it is common practice to fix the pins or solder balls at one end of the socket structure to the printed circuit board by soldering. As a result, it is difficult to detach the printed circuit board from the socket structure for recycling and reuse, and this may raise environmental protection issues. For example, during the development process of a new electronic product, it is often necessary to test the performances of different electronic devices (e.g., processors, voice chips, etc.) to be used. If the pins or solder balls at one end of a socket structure are soldered to the printed circuit board on which an electronic device to be tested is mounted, it will be impossible to detach the printed circuit board from the socket structure and use the same printed circuit board in different tests.

Moreover, when it is desired to stack and solder a plurality of electronic devices, printed circuit boards, and socket structures together as a three-dimensional (3D) structure, the limited space around the printed circuit boards and the socket structures tends to hinder the soldering process to be performed.

SUMMARY OF THE INVENTION

It is an object of the present invention to provide a socket structure stack and a socket structure thereof, wherein adjacent socket structures are connected by connecting elements configured as movable fastener units or rods. The connecting elements not only allow the adjacent socket structures to be conveniently connected to or detached from each other for repeated use, but also overcome the difficulties which may otherwise occur if the socket structures were to be soldered together.

It is another object of the present invention to provide a socket structure stack and a socket structure thereof, wherein the socket structure has a receiving portion for receiving the electronic devices mounted on a printed circuit board, so as to save space.

To achieve the above and other objects, the present invention provides a socket structure stack including at least two socket structures, wherein each socket structure includes a main body, a plurality of conductive elements, and a plurality of connecting elements. The main body is formed as a recessed structure and includes an inner plate and an outer plate. The inner plate has a receiving portion and an embedded portion, wherein the receiving portion is located at the center of the inner plate, and the embedded portion is provided around the receiving portion and has a first surface and a second surface. The outer plate surrounds the inner plate and the outer plate and the inner plate jointly form the recessed structure. The outer plate is thicker than the inner plate and has a third surface and a fourth surface. The conductive elements are embedded in the embedded portion, and each conductive element has a first end and a second end opposite the first end, wherein the first end and the second end are exposed on the first surface and the second surface respectively. The connecting elements are provided on the outer plate and configured for connecting adjacent socket structures.

To achieve the above and other objects, the present invention also provides a socket structure which includes a main body and a plurality of conductive elements. The main body is formed as a recessed structure and includes an inner plate and an outer plate. The inner plate has a receiving portion and an embedded portion, wherein the receiving portion is located at the center of the inner plate, and the embedded portion is provided around the receiving portion and has a first surface and a second surface. The outer plate surrounds the inner plate and the outer plate and the inner plate jointly form the recessed structure. The outer plate is thicker than the inner plate and has a third surface and a fourth surface. The conductive elements are embedded in the embedded portion, and each conductive element has a first end and a second end opposite the first end, wherein the first end and the second end are exposed on the first surface and the second surface respectively.

Implementation of the present invention at least produces the following advantageous effects:

1. The socket structures, as well as printed circuit boards and electronic devices (e.g., northbridge chips, voice chips, processors, DRAMs, and ICs) connected to the socket structures, can be recycled for reuse.

2. A printed circuit board mounted with such electronic devices as northbridge chips, voice chips, processors, DRAMs, and ICs can be easily assembled to the disclosed socket structure, and a plurality of such assemblies can be stacked up and conveniently connected to each other to form a 3D structure—which is hard to achieve if the socket structures and the printed circuit boards were to be connected by soldering.

BRIEF DESCRIPTION OF THE DRAWINGS

A detailed description of further features and advantages of the present invention is given below. The detailed description is intended to enable a person skilled in the art to gain insight into the technical contents disclosed herein and implement the present invention accordingly. A person skilled in the art can easily understand the objects and advantages of the present invention by referring to the disclosure of the specification, the claims, and the accompanying drawings, in which:

DETAILED DESCRIPTION OF THE INVENTION

Figure 1:
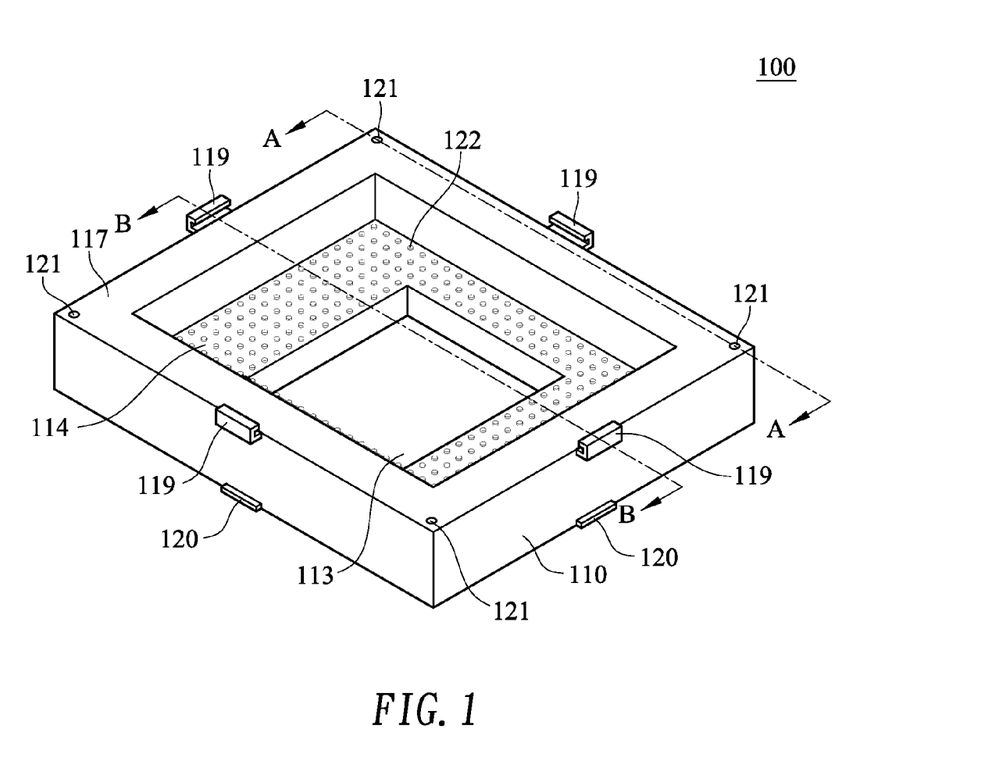
FIG. 1 is a perspective view of a socket structure according to a preferred embodiment of the present invention.
Figure 3:
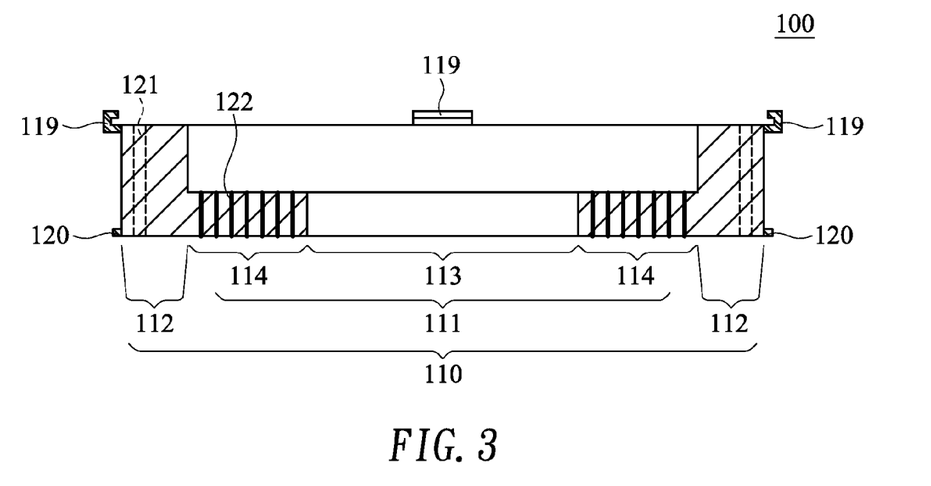
FIG. 3 is a sectional view taken along line BB in FIG. 1.
Figure 4:
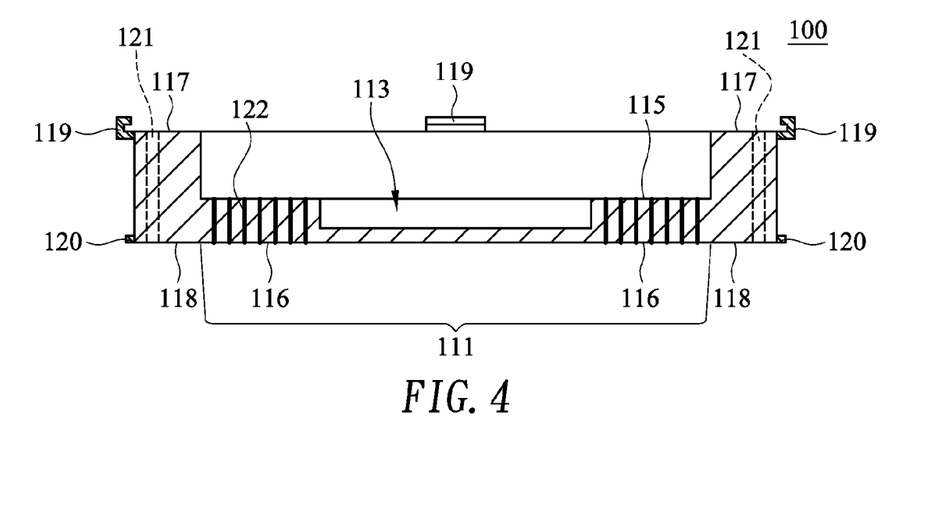
FIG. 4 is a sectional view of another preferred embodiment of the present invention taken along line BB.

Referring to FIGS. 1, 3, and 4, a socket structure 100 according to an embodiment of the present invention includes a main body 110 and a plurality of conductive elements 122.

As shown in FIGS. 3 and 4, the main body 110 is a recessed structure and includes an inner plate 111 and an outer plate 112.

The inner plate 111 is a board structure and can be divided mainly into a receiving portion 113 and an embedded portion 114. Referring to FIG. 1, the receiving portion 113 is located at the center of the inner plate 111. The receiving portion 113 either penetrates the inner plate 111 to form a hollowed-out portion (i.e., a through hole) as shown in FIG. 3, or is sunken into the inner plate 111 to form a recessed portion located at the center of the inner plate 111 and having a bottom provided by part of the inner plate 111, as shown in FIG. 4.

With reference to FIG. 3, the embedded portion 114 is provided around and thus surrounds the receiving portion 113. Referring also to FIG. 4, the embedded portion 114 has a first surface 115 and a second surface 116, wherein the first surface 115 is an upper surface of the embedded portion 114, and the second surface 116 is a lower surface of the embedded portion 114.

Figure 5:
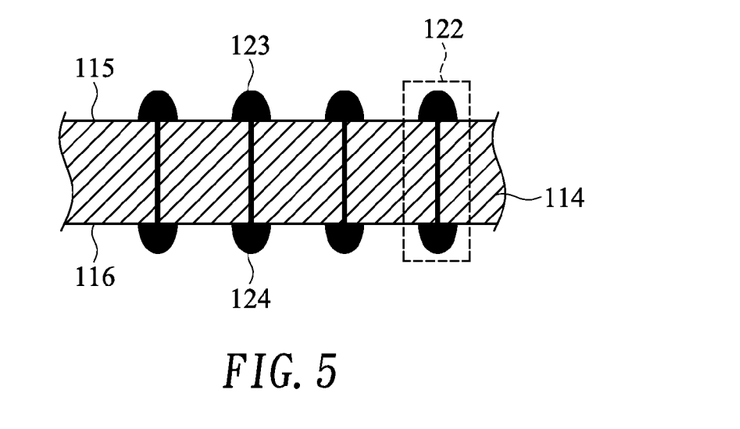
FIG. 5 is a sectional view of conductive elements according to an embodiment of the present invention, wherein the conductive elements are in the form of solder balls.
Figure 6:
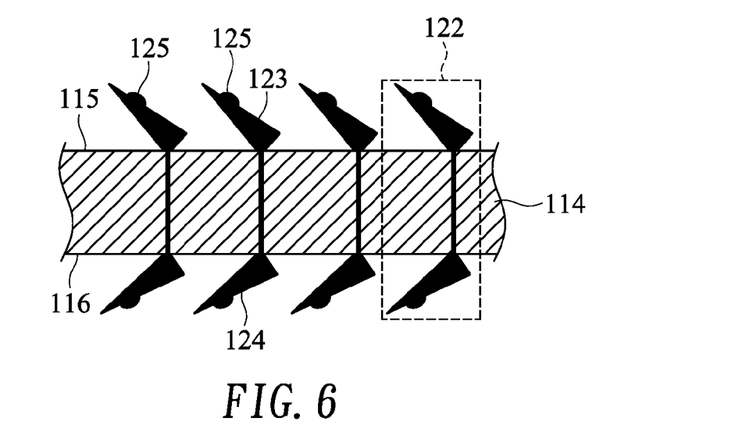
FIG. 6 is a sectional view of conductive elements according to another embodiment of the present invention, wherein the conductive elements are in the form of metal plates.
Figure 7:
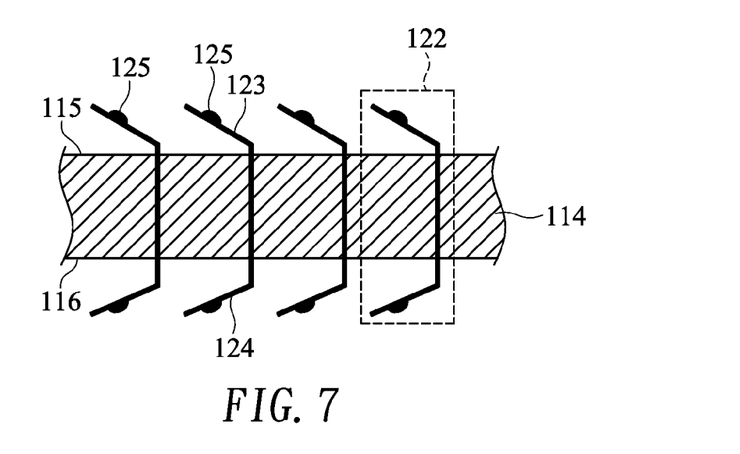
FIG. 7 is a sectional view of conductive elements according to still another embodiment of the present invention, wherein the conductive elements are in the form of resilient metal plates.

As shown in FIGS. 3 and 4, the conductive elements 122 are embedded in and vertically penetrate the embedded portion 114. Referring to FIGS. 5 to 7, the two opposite ends of each conductive element 122 are defined herein as a first end 123 and a second end 124, wherein the first end 123 is exposed on the first surface 115, and the second end 124 is exposed on the second surface 116. In other words, the first ends 123 extend beyond the first surface 115, and the second ends 124 extend beyond the second surface 116.

The first ends 123 and the second ends 124 can be solder balls (see FIG. 5), metal plates (see FIG. 6), or resilient metal plates (see FIG. 7). As shown in FIGS. 6 and 7, each of the first and the second ends 123, 124 further includes a protuberance 125 to facilitate electrical contact. The protuberances 125 are applicable to the metal plate-type conductive elements 122 as shown in FIG. 6, as well as the resilient metal plate-type conductive elements 122 as shown in FIG. 7.

Figure 8:
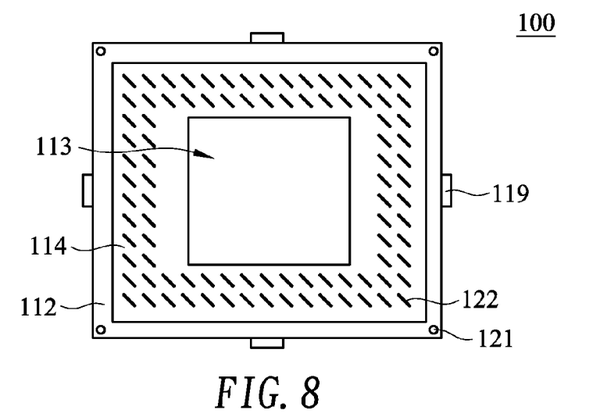
FIG. 8 schematically shows a hollow square-shaped distribution of the conductive elements according to the present invention.
Figure 9:
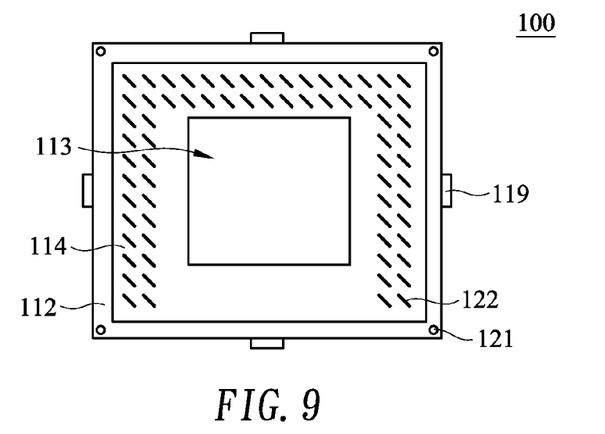
FIG. 9 schematically shows an inverted square U-shaped distribution of the conductive elements according to the present invention.
Figure 10:
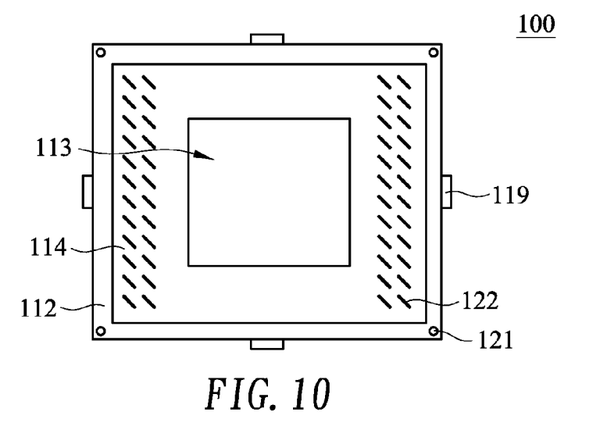
FIG. 10 schematically shows a double I-shaped distribution of the conductive elements according to the present invention.

The conductive elements 122 can be distributed over the embedded portion 114 in various ways. For example, referring to FIGS. 8 through 10, the conductive elements 122 can be arranged into a hollow square pattern (see FIG. 8), an inverted square U pattern (see FIG. 9), or a double-I pattern (see FIG. 10). In addition, the conductive elements 122 can be equally spaced from each other. As the hollow square-shaped arrangement of the conductive elements 122 as shown in FIG. 8 is of rotational symmetry, a socket structure 100 whose conductive elements 122 are so arranged can be connected to other socket structures 100 without regard to its own orientation. However, a socket structure 100 with rotationally symmetrically arranged conductive elements 122 uses a relatively large number of conductive elements 122, which is unfavorable to heat dissipation. In contrast, the conductive elements 122 in the inverted square U-shaped arrangement as shown in FIG. 9 and in the double I-shaped arrangement as shown in FIG. 10 allow better heat dissipation.

Referring to FIG. 3, the outer plate 112 surrounds the inner plate 111 and forms the aforesaid recessed structure together with the inner plate 111. Besides, the outer plate 112 is thicker than the inner plate 111. Referring also to FIG. 4, the outer plate 112 has a third surface 117 and a fourth surface 118, wherein the third surface 117 is an upper surface of the outer plate 112, and the fourth surface 118 is a lower surface of the outer plate 112.

Reference is now made to FIGS. 1, 3, and 4. In one embodiment of the present invention, the socket structure 100 further includes a plurality of connecting elements provided on the outer plate 112. The connecting elements can be a plurality of fastener units, wherein each fastener unit includes a first fastener 119 located at an edge of the third surface 117 and a second fastener 120 located at an edge of the fourth surface 118.

In this embodiment, each second fastener 120 has a plate-shaped configuration, and each first fastener 119 is a recumbent square U-shaped structure. The first fasteners 119 of a socket structure 100 can be pulled open to allow engagement with the second fasteners 120 of an overlying socket structure 100. In this embodiment, each of the four sides of the main body 110 is provided with one fastener unit to enable connection between adjacent socket structures 100.

While the first and the second fasteners 119, 120 in this embodiment are recumbent square U-shaped structures and plate-shaped structures respectively, the fasteners 119, 120 in another embodiment of the present invention can be so designed that they are engageable in the same way as telephone line or network cable connectors. A person skilled in the art may devise other implementation modes of the fasteners 119, 120 without departing from the scope of the present invention.

Figure 2:
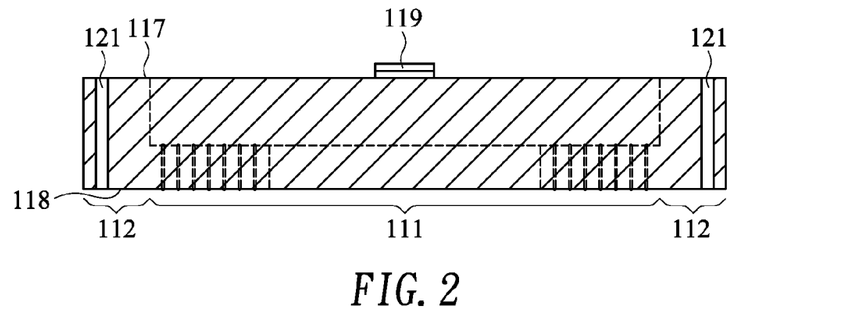
FIG. 2 is a sectional view taken along line AA in FIG. 1.

Referring to FIGS. 1 and 2, the outer plate 112 further has through holes 121. The through holes 121 are formed at the four corners of the main body 110 respectively and penetrate the outer plate 112 perpendicularly with respect to the third surface 117 and the fourth surface 118.

Figure 11:
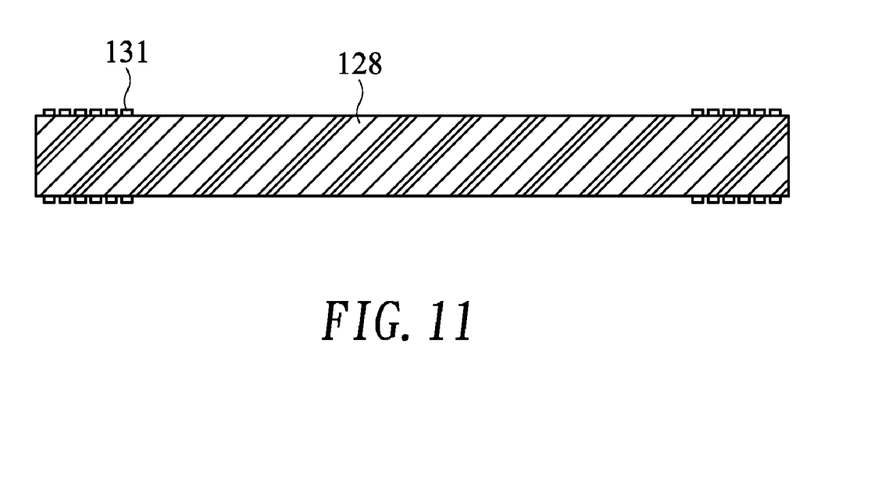
FIG. 11 is a sectional view of a printed circuit board.
Figure 12:
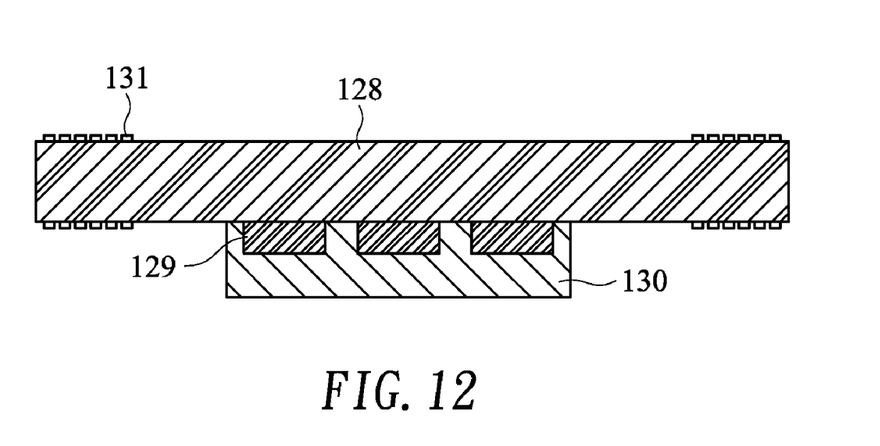
FIG. 12 is a sectional view of a printed circuit board mounted with electronic devices.

Please refer to FIG. 11 for a sectional view of a printed circuit board 128. A plurality of contacts 131 are provided along the four edges of the printed circuit board 128. Referring to FIG. 12, the printed circuit board 128 can be mounted with a variety of electronic devices 129, such as dies, chips (e.g., northbridge chips, southbridge chips, and voice chips), processors, DRAMs, and ICs. The electronic devices 129 mounted on the printed circuit board 128 can be packaged in and hence protected by an encapsulant 130 so that the functions of the electronic devices 129 will not be adversely affected by external impact or moisture.

Figure 13:
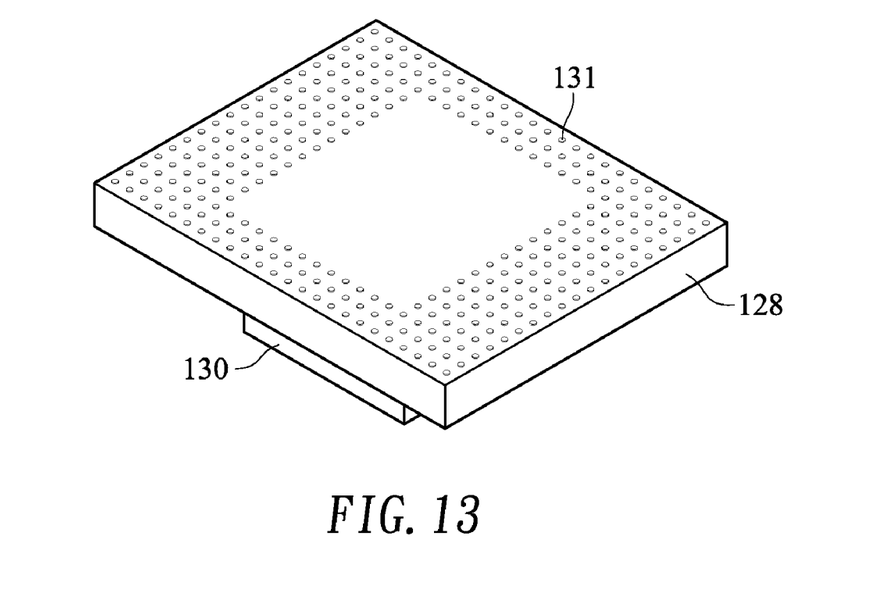
FIG. 13 is a perspective view of FIG. 12.
Figure 14:
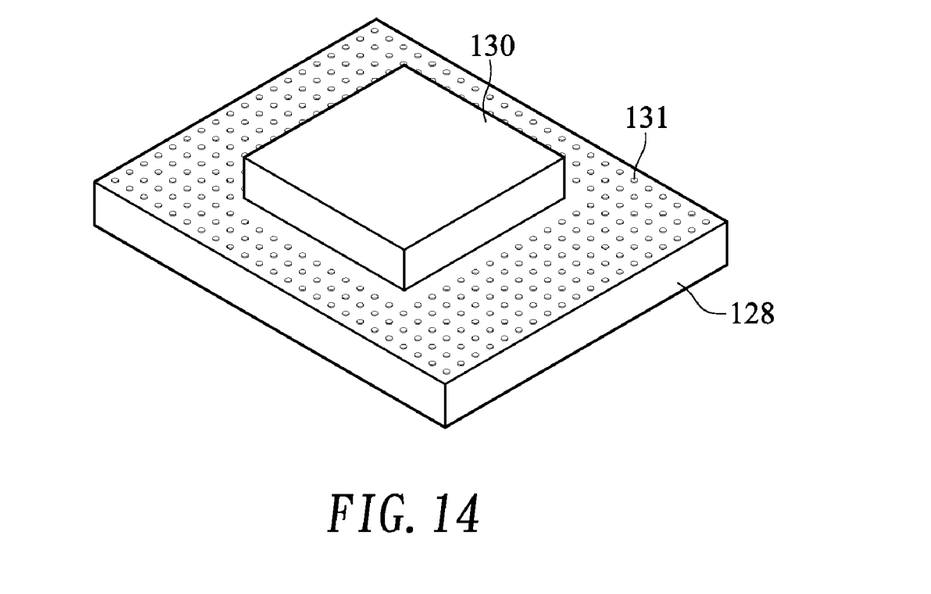
FIG. 14 is another perspective view of FIG. 12.

Referring to FIGS. 13 and 14, the encapsulant 130 is located at the center of the front side of the printed circuit board 128. The contacts 131 not only are provided on the front side of the printed circuit board 128 around the encapsulant 130, but also are provided on the backside of the printed circuit board 128. Further, the contacts 131 on both sides of the printed circuit board 128 are distributed in corresponding areas. In particular, the contacts 131 on the backside of the printed circuit board 128 are adjacent to the edges of the printed circuit board 128 and are so distributed as to form a hollow square.

Referring to FIG. 1 in conjunction with FIG. 13, the socket structure 100 in this embodiment is designed to accommodate and connect with the printed circuit board 128 mounted with the electronic devices 129 as shown in FIG. 13. The socket structure 100 corresponds in shape to and is therefore engageable with the printed circuit board 128 mounted with the electronic devices 129. Once the printed circuit board 128 mounted with the electronic devices 129 is placed in the socket structure 100, the contacts 131 on the printed circuit board 128 contact with the conductive elements 122 and are thus electrically connected thereto. The receiving portion 113 serves to receive the electronic devices 129 so that a plate-like structure is formed after the printed circuit board 128 mounted with the electronic devices 129 is connected with the socket structure 100. In plate-like structure thus formed, the backside of the printed circuit board 128 lies in substantially the same horizontal plane as the third surface 117 of the outer plate 112.

Figure 15:
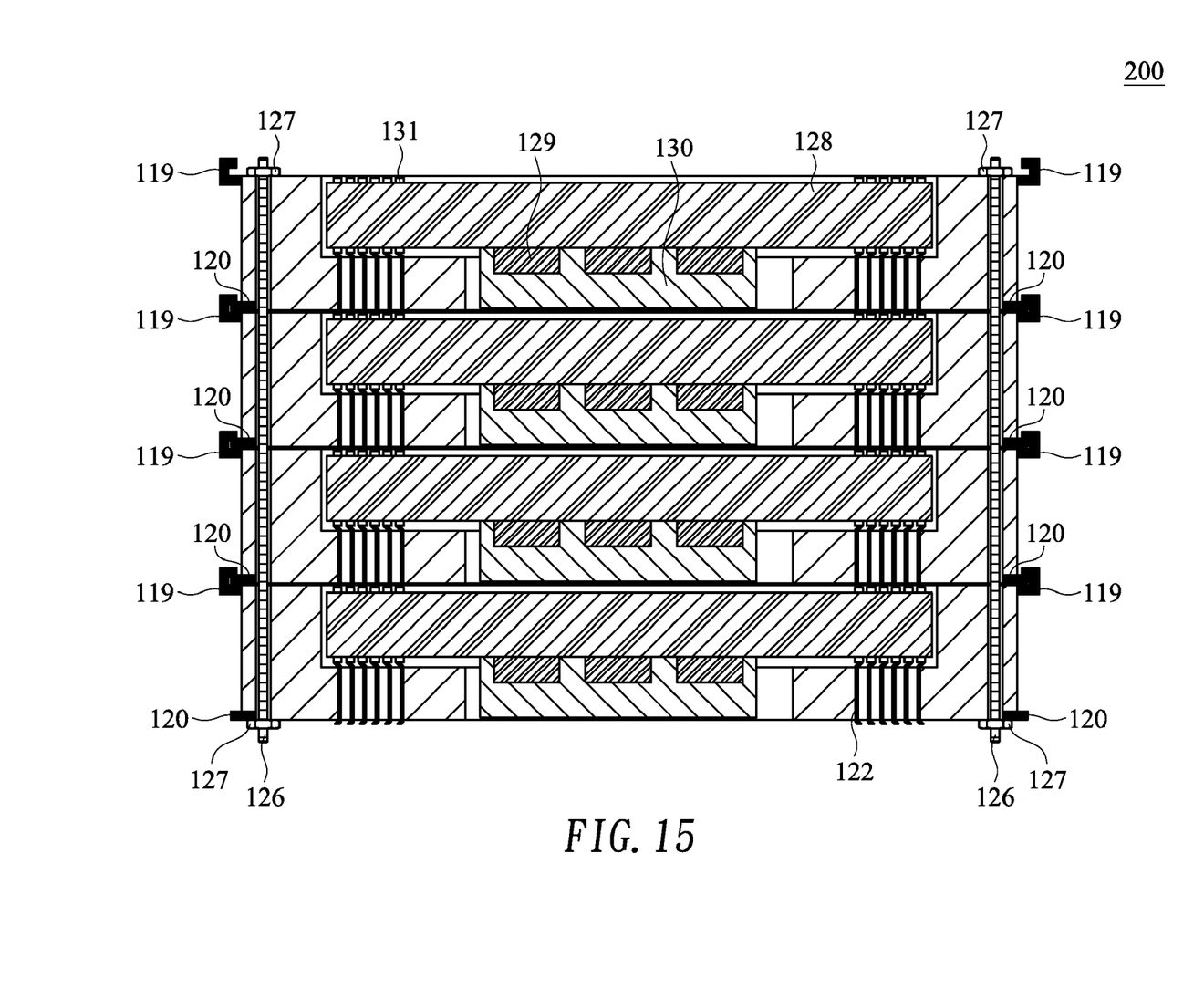
FIG. 15 is a front view of a 3D structure, i.e., a socket structure stack according to an embodiment of the present invention, comprised a plurality of socket structures and printed circuit boards, wherein each printed circuit board is mounted with a number of electronic devices.
Figure 16:
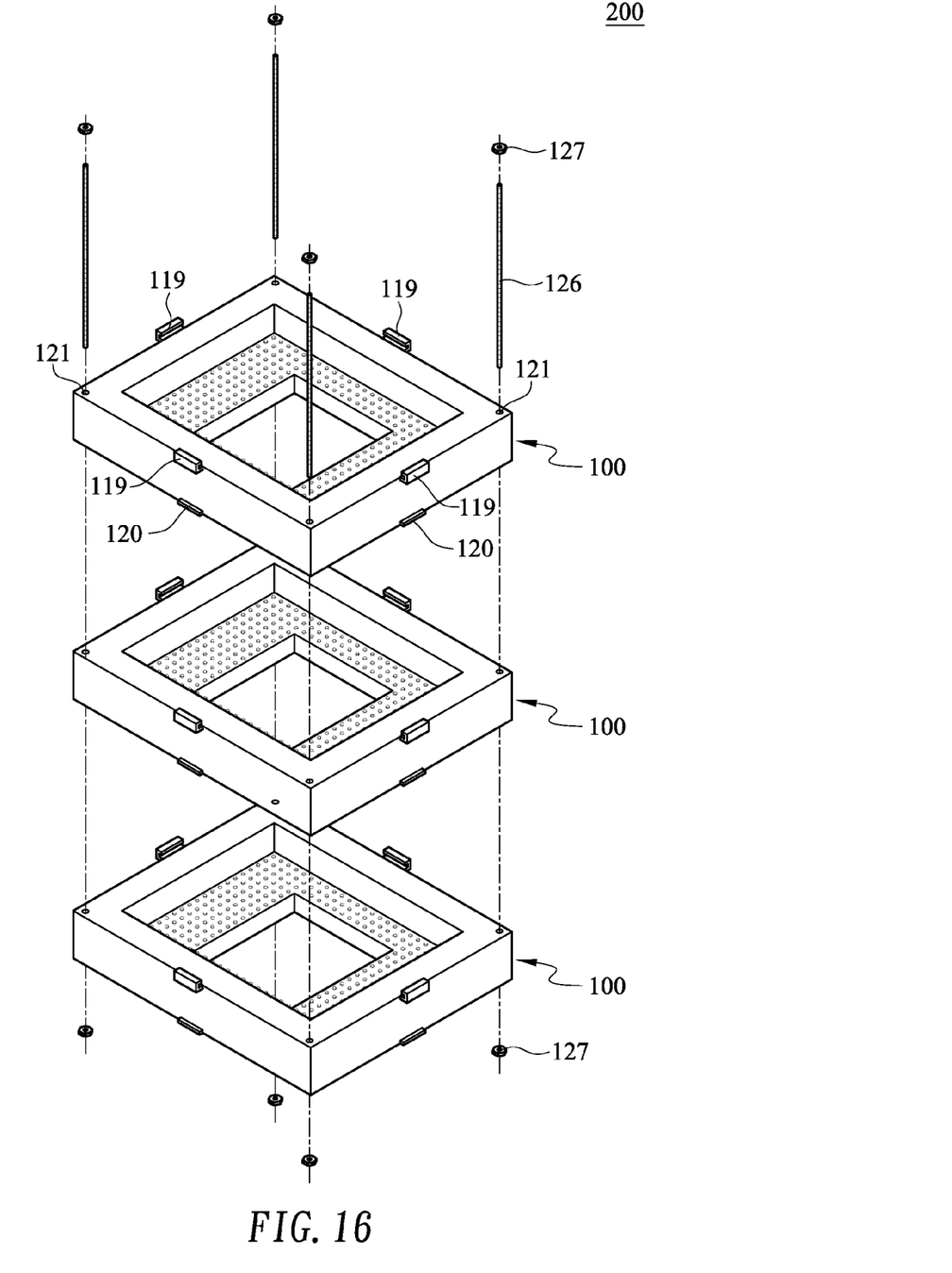
FIG. 16 is a perspective view of the socket structures depicted in FIG. 15, wherein the socket structures are in a disconnected state.

The present invention also provides a socket structure stack 200 as shown in FIGS. 15 and 16. The socket structure stack 200 includes at least two socket structures 100, wherein each socket structure 100 includes a main body 110, a plurality of conductive elements 122, and a plurality of connecting elements. The adjacent socket structures 100 in the socket structure stack 200 are connected by the connecting elements. As the socket structure 100 has been described in detail above, the same description will not be repeated here.

Referring to FIG. 15, a plurality of socket structures 100 and a plurality of printed circuit boards 128, each mounted with a number of electronic devices 129, are stacked up to form a 3D structure, and the socket structures 100 are connected to each other by the connecting elements. In this state, the second ends 124 of the conductive elements 122 of an upper socket structure 100 are electrically connected to the contacts 131 on the backside of the underlying printed circuit board 128. Thus, electrical connection within the socket structure stack 200 is achieved by electrical contact between the adjacent socket structures 100, and the difficulties which may otherwise occur if socket structures 100 and the printed circuit boards 128 were to be soldered together are overcome. Implementation of the present embodiment at least provides such an advantage as allowing the electronic devices 129 (e.g., northbridge chips, voice chips, processors, DRAMs, and ICs), the printed circuit boards 128, or the socket structures 100 to be recycled for repeated use. The present embodiment has also demonstrated that a plurality of printed circuit boards, each mounted with electronic devices, can be easily assembled to a plurality of socket structures and that the socket structures can be conveniently connected together to create a 3D structure.

Referring to FIG. 16, when it is desired to connect a plurality of socket structures 100, the fastener units can work in such a way that the second fasteners 120 of an upper socket structure 100 are engaged respectively with the first fasteners 119 of the underlying socket structure 100, thereby forming the socket structure stack 200. In addition, the connecting elements can be formed as rods 126 which penetrate the through holes 121 of the outer plates 112 so as to connect plural socket structures 100. Each rod 126 can be configured as a slender bolt 126 whose two ends are each fastenable with a screw nut 127. Once the bolts 126 pass through the corresponding through holes 121, the screw nuts 127 are fastened to the two ends of each bolt 126 so that all the printed circuit boards 128 and all the socket structures 100 are connected and in contact with each other. The closeness of such bolt-and-screw nut connection is higher than that achieved by the fastener units.

In the socket structure stack 200 of this embodiment, the socket structures 100 can be connected solely by passing the rods 126 through the through holes 121, or solely by means of the fastener units. It is understood that the rods 126 and the fastener units can also be used at the same time to provide even securer connection.

The embodiments described above serve to demonstrate the features of the present invention so that a person skilled in the art can understand the contents disclosed herein and implement the present invention accordingly. The embodiments, however, are not intended to limit the scope of the present invention, which is defined only by the appended claims. Therefore, all equivalent changes or modifications which do not depart from the spirit of the present invention should fall within the scope of the appended claims.

What is claimed is:

1. A socket structure stack, comprising at least two socket structures, each said socket structure comprising:
    a main body formed as a recessed structure and comprising:
        an inner plate having a receiving portion and an embedded portion, wherein the receiving portion is provided at a center of the inner plate, and the embedded portion is provided around the receiving portion and has a first surface and a second surface; and
        an outer plate surrounding the inner plate and forming the recessed structure in conjunction with the inner plate, the outer plate being thicker than the inner plate and having a third surface and a fourth surface;
    a plurality of conductive elements embedded in the embedded portion, each said conductive element having a first end and a second end opposite the first end, wherein the first end is exposed on the first surface, and the second end is exposed on the second surface; and
    a plurality of connecting elements provided on the outer plate;

wherein adjacent said socket structures are connected by the connecting elements, wherein in each said socket structure, the connecting elements are fastener units each comprising a first fastener provided at an edge of the third surface and a second fastener provided at an edge of the fourth surface, and the outer plate is formed with through holes perpendicular to the third surface and the fourth surface, and the connecting elements are rods configured for passing through the through holes of the socket structures and thereby connecting the socket structures, the first end and the second end of each said conductive element are resilient metal plates, metal plates, or solder balls, and the first fastener of a socket structure is a latch to engage with the second fastener which is a bar of an adjacent socket structure.

2. The socket structure stack of claim 1, wherein each said receiving portion is a hollowed-out portion or a recessed portion.

3. The socket structure stack of claim 1, wherein each of the first end and the second end of each said conductive element further includes a protuberance.

4. The socket structure stack of claim 1, wherein in each said socket structure, the conductive elements are distributed over the embedded portion in a hollow square-shaped, inverted square U-shaped, or double I-shaped arrangement.

5. The socket structure stack of claim 1, wherein the conductive elements of each said socket structure are equally spaced from one another.

6. A socket structure, comprising:

a main body formed as a recessed structure and comprising:

an inner plate having a receiving portion and an embedded portion, wherein the receiving portion is provided at a center of the inner plate, and the embedded portion is provided around the receiving portion and has a first surface and a second surface; and an outer plate surrounding the inner plate and forming the recessed structure in conjunction with the inner plate, the outer plate being thicker than the inner plate and having a third surface and a fourth surface;

a plurality of conductive elements embedded in the embedded portion, each said conductive element having a first end and a second end opposite the first end, wherein the first end is exposed on the first surface, and the second end is exposed on the second surface; and a plurality of connecting elements provided on the outer plate, wherein the connecting elements are fastener units each comprising a first fastener provided at an edge of the third surface and a second fastener provided at an edge of the fourth surface, the outer plate is formed with through holes perpendicular to the third surface and the fourth surface, the first end and the second end of each said conductive element are resilient metal plates, metal plates, or solder balls and the first fastener of the socket structure is a latch to engage with the second fastener which is a bar of an adjacent socket structure.

7. The socket structure of claim 6, wherein the receiving portion is a hollowed-out portion or a recessed portion.

8. The socket structure of claim 6, wherein each of the first end and the second end of each said conductive element further includes a protuberance.

9. The socket structure of claim 6, wherein the conductive elements are distributed over the embedded portion in a hollow square-shaped, inverted square U-shaped, or double I-shaped arrangement.

10. The socket structure of claim 6, wherein the conductive elements are equally spaced from one another.

* * * * *